(12) United States Patent
Cleveland et al.

(10) Patent No.: US 6,654,848 B1
(45) Date of Patent: Nov. 25, 2003

(54) SIMULTANEOUS EXECUTION COMMAND MODES IN A FLASH MEMORY DEVICE

(75) Inventors: Lee E. Cleveland, Santa Clara, CA (US); Kendra Nguyen, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 09/662,791

(22) Filed: Sep. 15, 2000

(51) Int. Cl.[7] .............................................. G06F 12/00
(52) U.S. Cl. ........................... 711/103; 711/5; 711/168; 365/185.33; 365/230.03
(58) Field of Search ................................. 711/103, 173, 711/168, 5; 365/185.33, 230.03

(56) References Cited

U.S. PATENT DOCUMENTS

| | | |
|---|---|---|
| 5,261,064 A | 11/1993 | Wyland |
| 5,495,442 A | 2/1996 | Cernea et al. |
| 5,559,990 A | 9/1996 | Cheng et al. |
| 5,748,528 A | 5/1998 | Campardo et al. |
| 5,841,696 A * | 11/1998 | Chen et al. ............. 365/185.11 |
| 5,847,998 A | 12/1998 | Van Buskirk |
| 5,864,505 A * | 1/1999 | Higuchi ................. 365/189.04 |
| 5,867,430 A * | 2/1999 | Chen et al. ............ 365/189.04 |
| 6,160,750 A * | 12/2000 | Shieh ..................... 365/230.03 |
| 6,205,084 B1 * | 3/2001 | Akaogi ........................ 365/194 |
| 6,278,654 B1 * | 8/2001 | Roohparvar ........... 365/185.33 |

OTHER PUBLICATIONS

AMD Publication titled Am29DS323D 32 Megabit (4 M × 8–Bit/2 M × 16–Bit) CMOS 1.8 Volt–only, Simultaneous Operation Flash Memory, AMD Publication No. 22480, dated: Jan. 25, 2000.

* cited by examiner

Primary Examiner—Hiep T. Nguyen

(57) ABSTRACT

A method for operating a flash memory includes, in response to a received operation command, initiating an embedded operation of the flash memory and subsequently, during execution of the embedded operation, in response to a received read command, initiating a burst read operation of the flash memory.

19 Claims, 12 Drawing Sheets

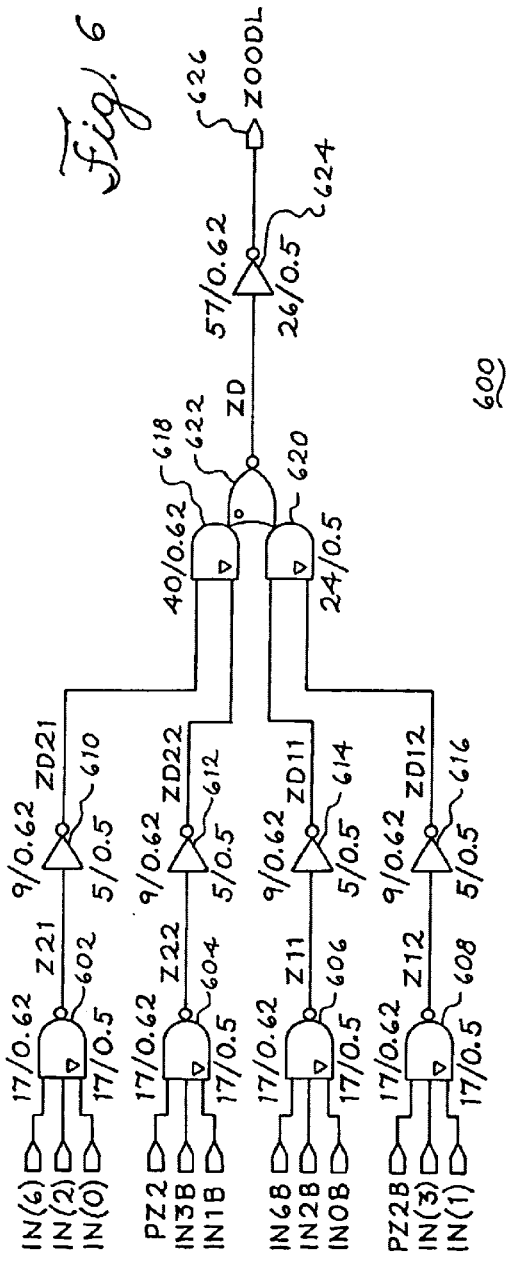
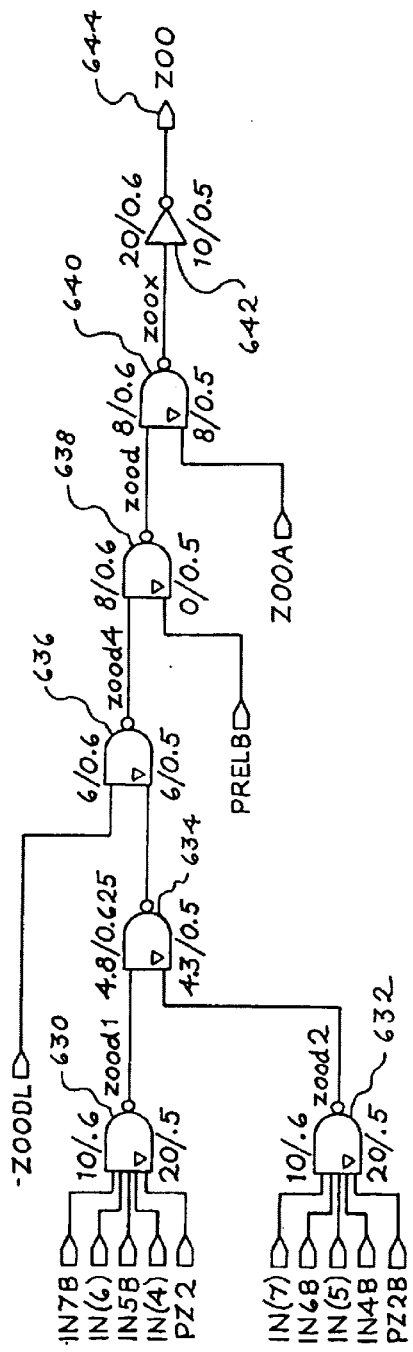
Fig. 6

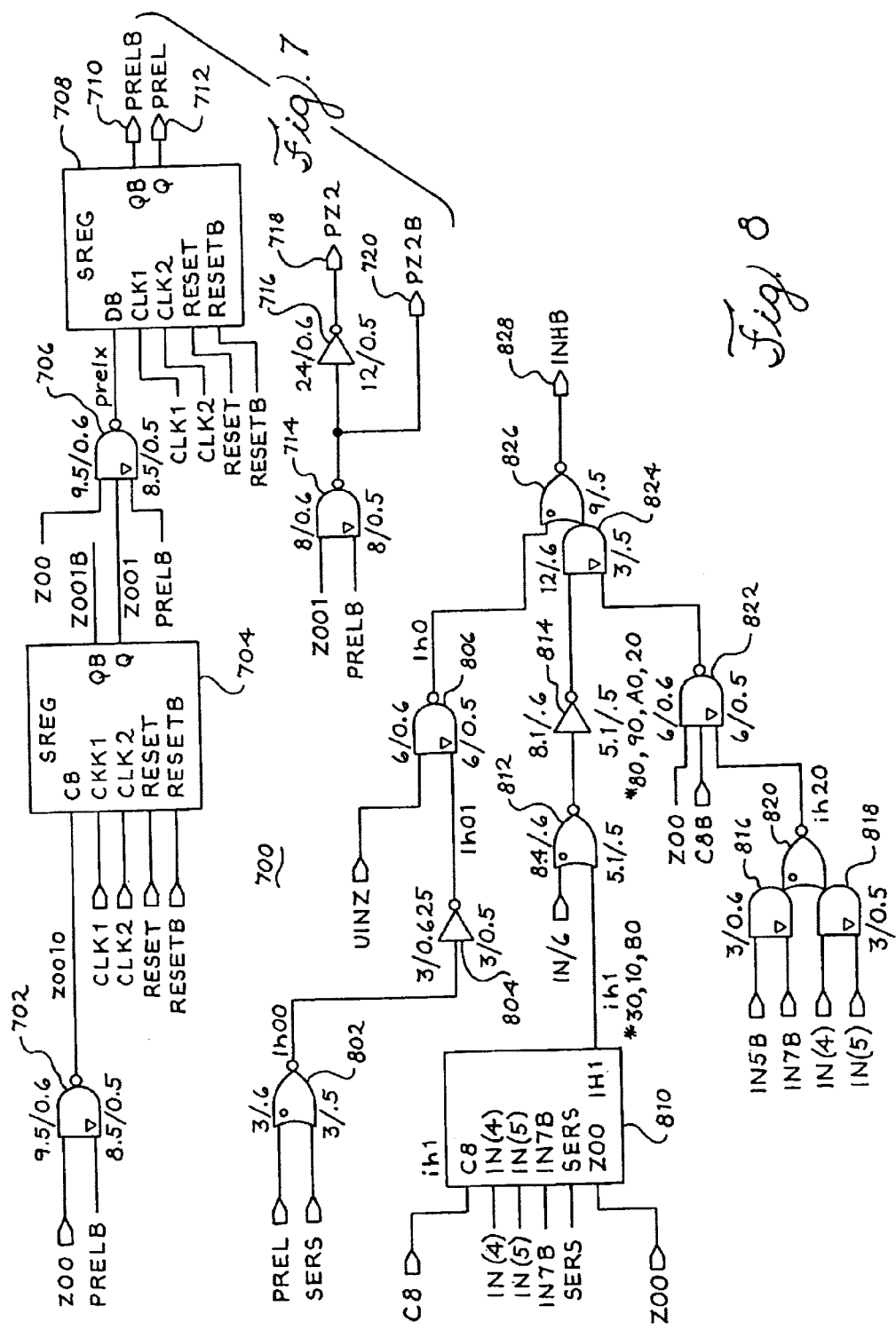

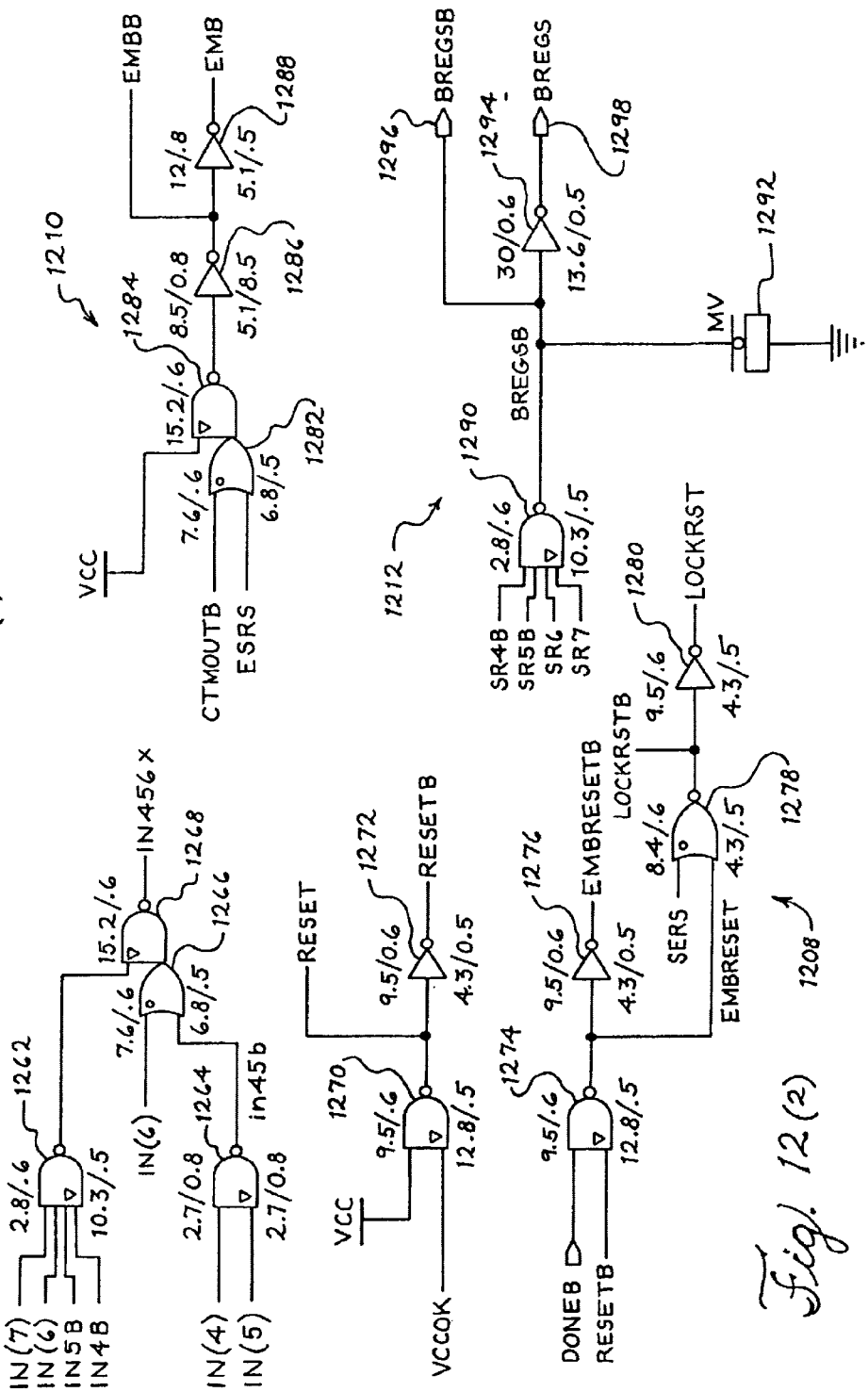
Fig. 12 (2)

SIMULTANEOUS EXECUTION COMMAND MODES IN A FLASH MEMORY DEVICE

BACKGROUND OF THE INVENTION

The present invention relates generally to memory devices. More particularly, the present invention relates to a flash memory device having a dual bank, simultaneous operation architecture.

Flash memory devices are increasingly popular for providing data storage in data processing systems. Flash memories are non-volatile, meaning that stored data is retained when power is interrupted to the memory. Flash memories provide read and write capability. Data that has been written in a flash memory may be erased on a sector-by-sector basis and erased sectors may be subsequently rewritten. Flash memories provide large capacity, with current generations storing 32 MB or more of data. Also, flash memories provide fast access, with read access times on the order of 125 ns or less.

Next generation memories are being designed which extend the features and capabilities of conventional flash memories. Conventional flash memories have a limitation in that a write operation and a read operation are mutually exclusive. Write and read operations are conventionally embedded operations requiring a sequence of steps including on-chip voltage generation and logical operations. The embedded read and write operations are under control of a state machine. The write operation consists of erase, program and verify operations which are relatively slow, taking on the order of microseconds to execute. During the erase, program and verify operations, read operations are precluded. This can be inconvenient for the user.

Accordingly, one extension of conventional memory design is dual bank, simultaneous operation architecture. Such an architected memory has an array of core cells that is separated into two independent banks referred to as the upper bank and the lower bank. The circuitry necessary for reading and writing data in each bank is independent for each bank. In this manner, a read operation can occur in one bank while a write operation occurs in another bank. Control circuitry in the form of an on-chip state machine controls the internal processes needed to read and write the data in the separate banks.

Another limitation of conventional flash memories is a relatively slow asynchronous read access time. This corresponds to the delay from the application of a valid address to the address pins of the memory to the presentation of valid data at the output pins of the memory. As noted, in current generation memories, the asynchronous access time is on the order of 125 ns. However, many current data processing systems require data access times much less than this.

Accordingly, burst read capability has been developed. In burst read mode, a clock signal is provided to the memory and a sequence of contiguous data is read from the memory on each cycle of the clock, which can be, for example, 25 ns. Externally, the burst read data all have sequential addresses. Internally, the burst read data are stored in core cells having a common row or word line. Once the common word line is selected, all data bits stored in core cells on that word line can be read out, again under control of the on-chip state machine. This substantially reduces the read access time for entire burst, although the asynchronous access time must elapse before the first burst data is available. This is particularly efficient, for example, for accessing boot code by a data processing system on power up or after a reset, when a sequence of consecutive instructions and data are required for booting the system.

For next generation devices, it will be desirable to combine simultaneous operation with burst read operation. However, when embedded processes are performed under control of the state machine, other commands are ignored or locked out. Conventional flash devices do not allow the user to issue any other command once an embedded erase or program command has been given. This ensures that the embedded algorithm will not be disturbed. Accordingly, there is a need for a method and apparatus for simultaneous execution of command modes in a flash memory.

SUMMARY

By way of introduction only, the present embodiments provide an improved method and apparatus for simultaneous execution of read and write modes in a flash memory. After an embedded operation such as a sector erase is started in the memory, most other commands are ignored or locked out to prevent disturbing the embedded operation. Exceptions are made for a predetermined subset of commands, such as a burst read command. The command data for the executing embedded command is latched in the memory. Subsequent commands are decoded. Any commands other than these are ignored and no further action is taken. The excepted command is latched in to registers for subsequent processing. To accomplish this, internal signals are modified to remain active during the embedded operation for decoding and latching the excepted commands.

The foregoing discussion of the preferred embodiments has been provided only by way of introduction. Nothing in this section should be taken as a limitation on the following claims, which define the scope of the invention.

BRIEF DESCRIPTION OF SEVERAL VIEWS OF THE DRAWINGS

FIG. 6 is a schematic diagram of zero or one logic of the state machine of FIG. 2;

FIG. 7 is a schematic diagram of zero or one and prelude registers of the control logic of the state machine of FIG. 2;

FIG. 8 is a schematic diagram of an inhibit circuit of the control logic of the state machine of FIG. 2;

DETAILED DESCRIPTION OF THE PRESENTLY PREFERRED EMBODIMENTS

Figure 1:
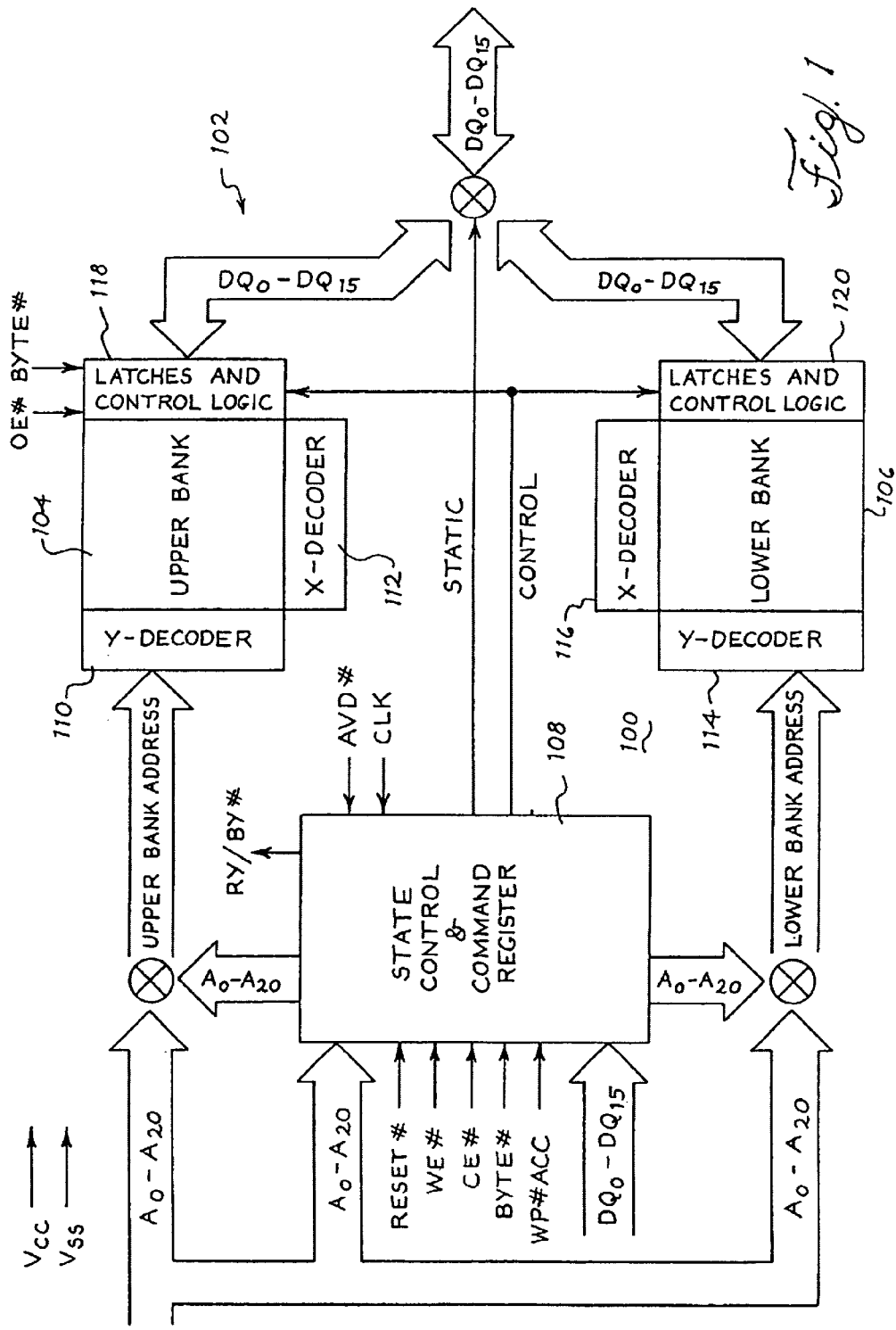
FIG. 1 is a block diagram of a flash memory.

Referring now to the drawings, FIG. 1 shows a block diagram of a flash memory 100. The flash memory 100 includes a core cell array 102, including an upper bank 104 and a lower bank 106, and a state machine 108. Preferably, the memory 100 is a flash memory or other memory. A non-volatile memory stores data even after operating power has been removed from the memory. Data may be written to individual storage locations by programming flash memory cells at those locations. The data may be subsequently read from the storage locations. Data may be erased on a sector-by-sector basis, where sectors are subdivisions of the overall storage space of the memory 100. In addition to a sector erase operation, a chip erase operation may also be performed in which the entire storage space is returned to an initial unprogrammed condition.

The core cell array 102 includes a plurality of core cells, each core cell configured to store one or more bits of data. Each core cell is independently addressable using address inputs A0 through A20 of the memory 100. The address inputs are decoded in a Y decoder 110 and an X decoder 112 associated with the upper bank 104 and in a Y decoder 114 and an X decoder 116 associated with the lower bank 106. The upper bank 104 and the lower bank 106 are each subdivided into a plurality of sectors. Sectors in some embodiments are of the same size but may be of different size. Data is stored to and read from the core cell array using latches and control logic 118 associated with the upper bank and latches and control logic 120 associated with the lower bank 106.

The memory 100 provides simultaneous operation in the two banks 104, 106. A read operation may take place in a first bank while a write operation occurs in a second bank of the two banks 104, 106. A write operation includes both a program operation, to write data to the addressed location, and a verify operation to confirm the programmed data. The data to be written is provided to the data input/output (I/O) pads DQ0–DQ15. The address for storage is provided to the address pads A0–A20.

A read operation may be one of an asynchronous read or, in the illustrated embodiment, a burst read. In an asynchronous read operation, an address is presented to the address pads A0–A20 of the memory 100 and, after elapse of a time duration referred to as the asynchronous address time, valid data is available from the memory at the data I/O pads DQ0–DQ15. In a burst read, an initial address is provided to the address pads A0-A20 along with a signal to the valid address pad AVD#. After elapse of the asynchronous address time, valid data is available at the data I/O pads DQ0–DQ15. Subsequently, in accordance with burst read mode, a clock signal to the clock input CLK may be toggled to access data from a next address of the memory 100. After actuation of the clock signal and after elapse of the burst access time, valid data is available at the data I/O pads DQ0–DQ15. The burst access time is typically much less than the asynchronous access time, decreasing the average read access time of the memory and providing a convenient user feature.

Operations such as write, verify and erase are performed as embedded operations under control of the state machine 108. In an embedded operation, the user of the memory provides one or more commands to the memory 100 defining the operation to be performed. The state machine 108 responds to these commands by controlling performance of the specified operation without further user intervention. For example, in a sector erase operation, the user provides a command indicating the sector erase operation along with an address of the sector to be erased. If the correct command sequence is entered, the state machine 108 initiates a time out period of predetermined duration, such as 100 µsec. After this time, the memory 100 under control of the state machine provides the necessary erase voltages to the required sector to erase the sector. Subsequently, the state machine initiates a verify operation to verify that the sector has been erased. These operations are performed fully under control of the state machine 108. During execution of these embedded operations, most other operations of the memory 100 are locked out or ignored.

The memory 100 includes other circuitry omitted from FIG. 1 so as not to unduly complicate the drawing figure. Examples of such circuitry are address buffers, program voltage generators and clocking circuitry. As indicated in FIG. 1, the memory 100 operates in response to supply voltage Vcc and Vss. In typical applications, Vcc is approximately 1.8 volts and Vss is at ground.

Figure 2:
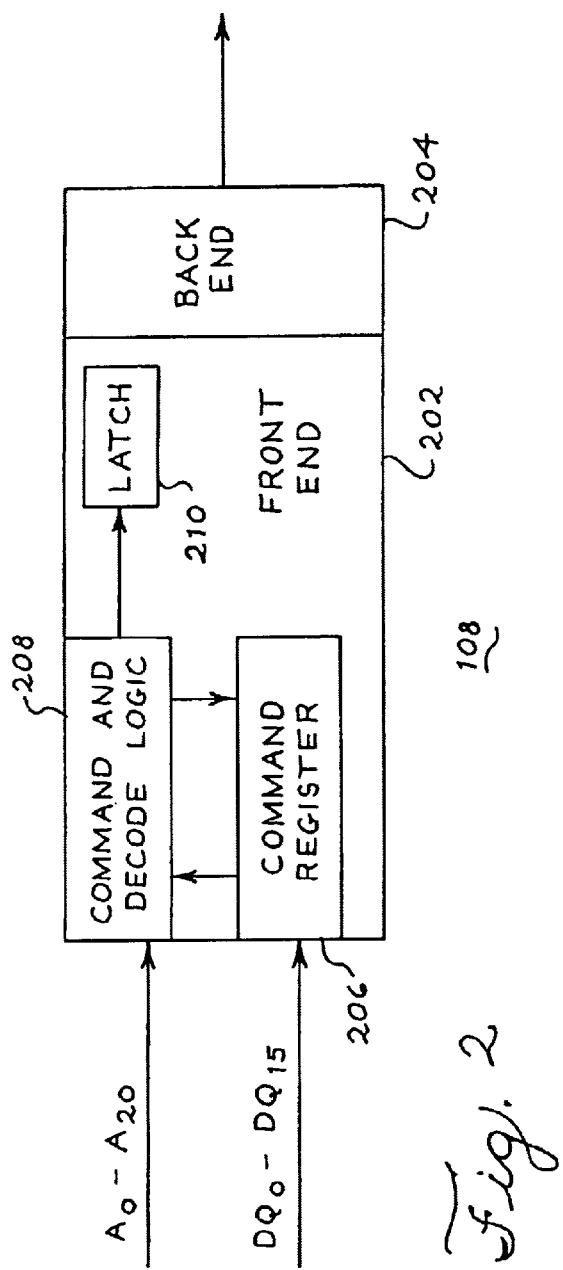
FIG. 2 is a block diagram of a state machine of the flash memory device of FIG. 1.

FIG. 2 is a block diagram of the state machine 108 of FIG. 1. As illustrated in FIG. 2, the state machine 108 includes a front end 202 to decode received user commands and a back end to control embedded operations including the embedded write operation in response to user commands.

The front end 202 includes a command register 206, command and decode logic 208, and a latch 210. The command register 206 receives and stores a command provided by the user. The command and decode logic 208 decodes the command to determine if the command is valid and if the command may be executed. For example, once an embedded operation such as a sector erase is started in one bank of the memory 100 (FIG. 1) by the state machine 108, other commands are inhibited with the exception of a predetermined excepted subset of commands such as a burst read in the other bank. The latch 210 stores the currently executing command so that a subsequent command may be received in the command register 206 and decoded in the command and decode logic 208. In the illustrated embodiment, the front end 202 is implemented as random logic hardwired together. Other implementations may also be used, such as a programmable logic array or by substituting software for hardware components while preserving the same functionality.

The back end 204 executes the commands received and decoded by the front end 202. In the preferred embodiment, the back end is implemented as a programmable logic array (PLA) in which input states received from the front end 202 are decoded to determine next states or output states for execution of the embedded operation. Next state data is output from the back end 204 to control the memory 100 in performing the embedded operation.

Conventional flash memories do not allow a user to issue any other command once an erase or program (write) command has been given. One reason for this is to ensure that the embedded erase or program algorithm will not be disturbed. The illustrated embodiments extend the functionality of a simultaneous operation flash device in which a user needs to issue burst read or other commands during an erase or program operation.

In the illustrated embodiments, the state machine 108 controls the logic flow for implementing the simultaneous commands. The state machine 108, as noted, includes a front end 202 which accepts a user's inputs and generates commands, and a back end 204. Commands like sector erase (SERS) and chip erase (ERS) or program (PGMS) should remain active until the embedded mode finishes.

Accordingly, latches such as the latch 210 and registers such as the command register 206 are used to keep the commands from being disturbed when a burst read command is to be issued. The following figures are simplified schematic diagrams illustrating the state machine 108 design for implementation of simultaneous sector erase and burst read.

Figure 3:
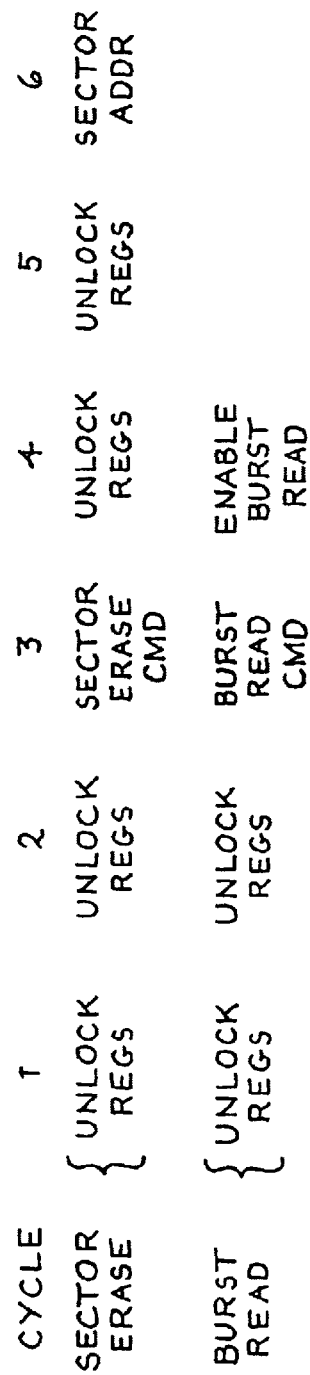
FIG. 3 illustrates commands to be provided to the state machine of FIG. 2 for performing operations in the memory of FIG. 1.

FIG. 3 illustrates a commands sequence necessary to initiate a sector erase and a burst read operation. The commands are entered to the memory 100 by a user via the address inputs A0–A20 and the data I/O pads DQ0–DQ15. The sector erase command is a six cycle command. Cycles are defined by input of commands and any control signals to the memory 100. These control signals include the write enable signal WE#. During first and second cycles, a command to unlock the command registers of the state machine 108 is provided. In the illustrated embodiment, this command has the value 55H, where the H suffix indicates the number is hexadecimal. On the third cycle, the sector erase command is given. This command in one embodiment has the value 30H. During the fourth and fifth cycles, the register unlock command is repeated and during the sixth cycle, the sector address of the sector to be erased is provided. Execution of the sector erase embedded operation then begins. The commands must be entered by the user in the required sequence. If not, the memory 100 is reset to a default condition, such as a read condition. The sector erase command includes two repetitions of the register unlock command and a total of six cycles to help prevent inadvertent sector erasure.

The burst read command sequence is four cycles long. The command sequence begins with the unlock register command on cycles one and two. On the third cycle, the burst read command is given. In the current embodiment, this command has the value C0H. On the fourth cycle, appropriate data is decoded to enable burst read and the memory 100 changes from its default asynchronous read mode to burst read mode.

Figure 4:
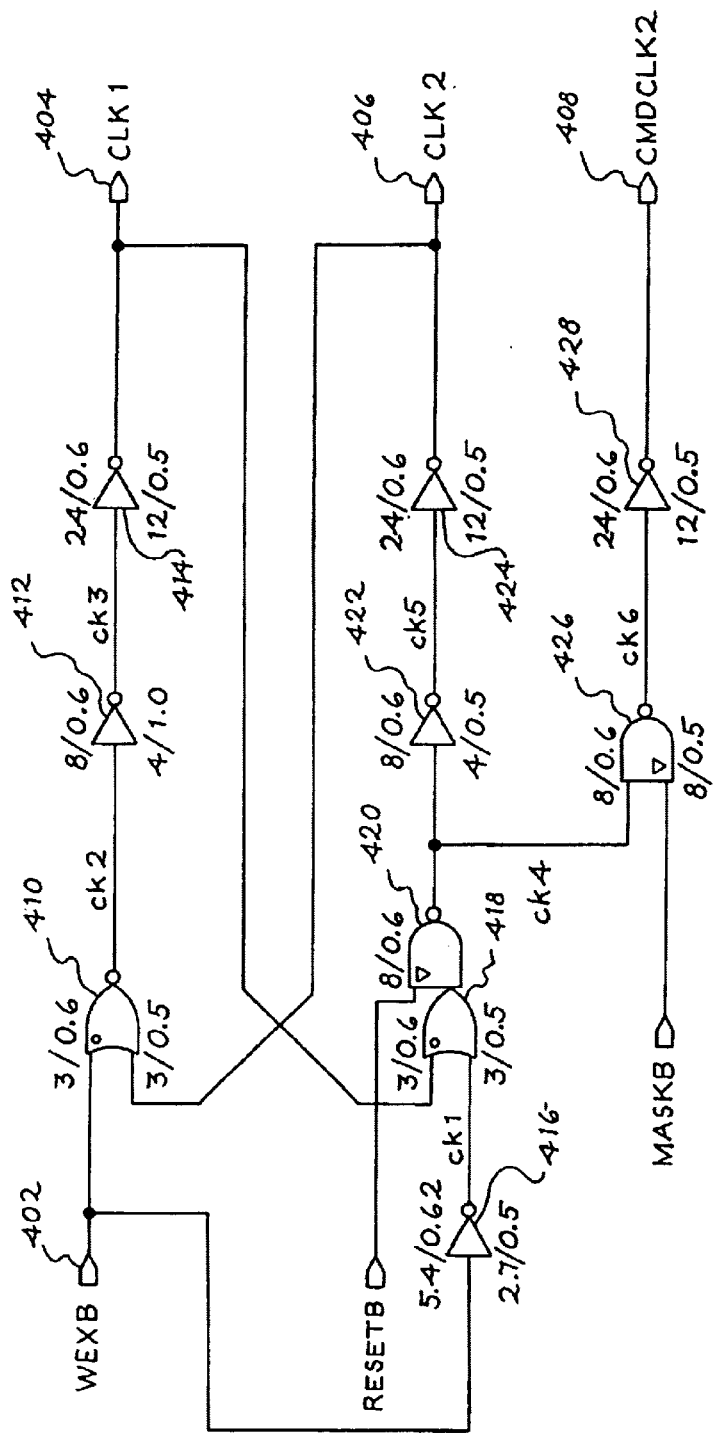
FIG. 4 is a schematic diagram of a clocking circuit of the state machine of FIG. 2.

FIG. 4 is a schematic diagram of a clock signal generator circuit 400 of the state machine 108 of FIG. 2. The circuit 400 receives an internal write enable signal WEXB at an input 402 and generates non-overlapping clock signals CLK1 and CLK2 at outputs 404, 406, respectively. The circuit 400 also generates a command clock signal CMDCLK2 at output 408.

The circuit 400 includes a NOR gate 410, inverters 412, 414, 416, OR gate 418, NAND gate 420, inverters 422, 424, NAND gate 426 and inverter 428. WEXB is an internal signal that is active low (logic 0) when the signal at the write enable input WE# to the memory 100 (FIG. 1) is low, indicating a write operation is desired. When the input WE# pulses low, data is expected at the data I/O pads DQ-1DQ15. When the input WE# pulses low, the internal signal WEXB pulses low also, generating CLK1 and CLK2 at the outputs 404, 406.

The signal WEXB is inverted in the NOR gate 410. The output of the NOR gate is inverted in the inverters 412, 414 so that the falling edge on WEXB produces a rising edge on CLK1. The falling edge on WEXB is also inverted in the inverter 416 and the NAND gate 420, which is controlled by the reset signal RESETB. The output signal from the NAND gate 420 is subsequently inverted in inverters 422, 424 to produce a falling edge on CLK2. The output of the NAND gate 420 is provided to an input of the NAND gate 426. Under control of the signal MASKB, this signal is inverted in the NAND gate 426 and again inverted in the inverter 428 to generate the command clock signal CMDCLK2. Description of the generation of the signal MASKB will be described below in conjunction with FIG. 9.

Figure 5:
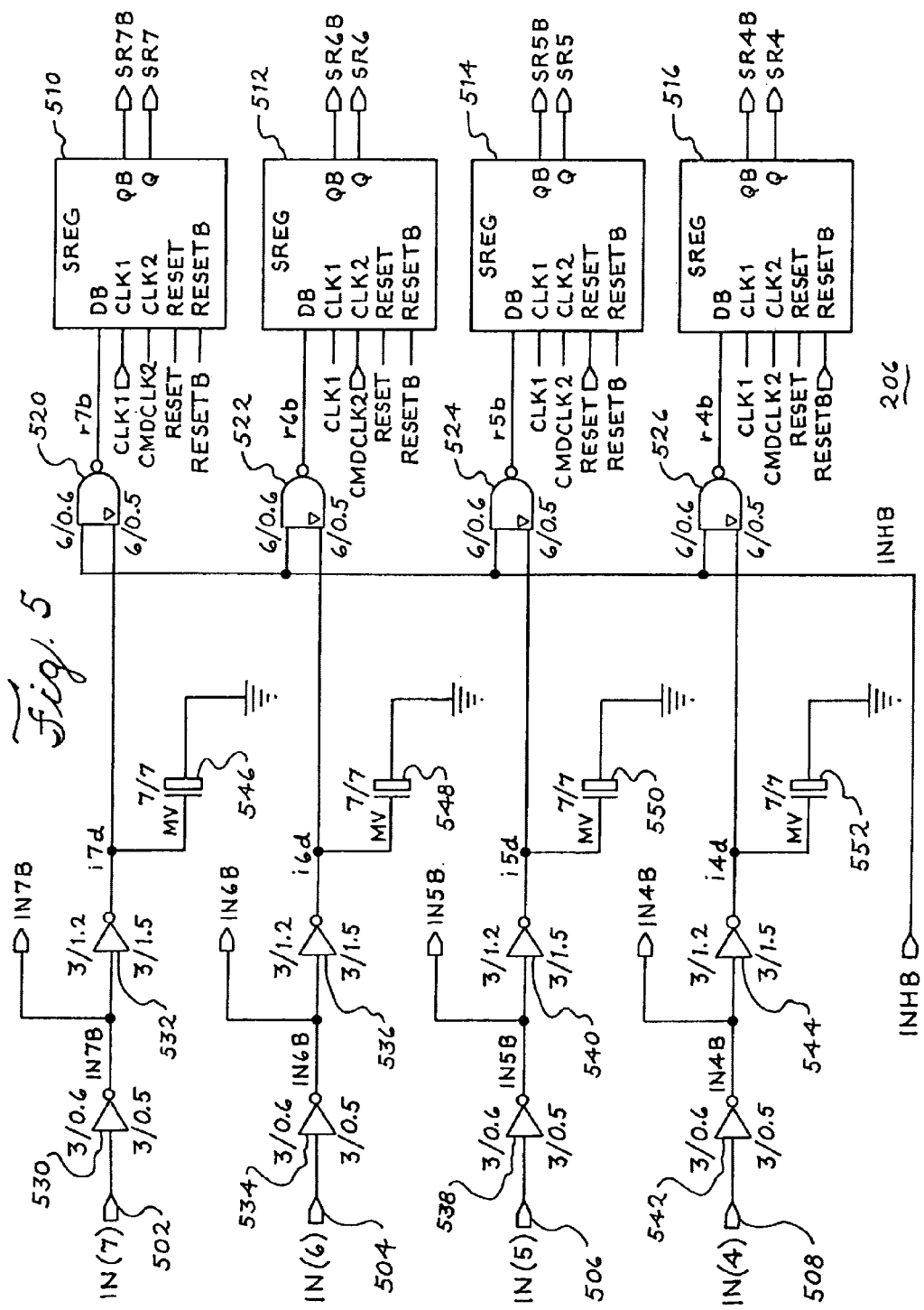
FIG. 5 is a schematic diagram of the command register of FIG. 2.

FIG. 5 is a circuit diagram illustrating the command register 206 of the state machine 108 of FIG. 2. The command register 206 is configured to receive input data at inputs 502, 504, 506, 508. The command register 206 includes registers 510, 512, 514, 516 and inhibit gates 520, 522, 524, 526 associated with the registers 510, 512, 514, 516, respectively. Further, the command register 206 includes inverters 530, 532 associated with the input 502, inverters 534, 536 associated with the input 504, inverters 538, 540 associated with the input 506 and inverters 542, 544 associated with the input 508. Lastly, capacitors 546, 548, 550, 552 are associated with inputs 502, 504, 506, 508, respectively.

The registers 510, 512, 514, 516 respond to the non-overlapping clocks CLK1, CLK2 and CMDCLK2 to store data at the data input DB of each register. The input inhibit signal INHB is provided to the input of the NAND gates 520, 522, 524, 526 and is asserted to inhibit writing to the registers 510, 512, 514, 516. Generation of the signal INHB will be described below. Each of the registers 510, 512, 514, 516 also has RESET and RESETB inputs for resetting the contents of the register. The output signals from the registers are the true and complement values of the stored command data, SRn and SRnB, n=4, 5, 6, 7.

The inverters 530, 532, 534, 536, 538, 540, 542, 544 generate complement values of the input data IN(7), IN(6), IN(5), IN(4), as well as buffering the input data. These input data bits correspond to the command data provided by the user to selected ones of the DQ0–DQ15 inputs (FIG. 1). Other input data bits may be received as well. In the present embodiment using sector erase as an exemplary embedded operation, input data IN(7)–IN(4) are shown since they decode the sector erase command directly. The capacitors 546, 548, 550, 552 operate as noise filters to prevent unintended transitions on the input data.

FIG. 6 is a schematic diagram illustrating zero or one logic circuit 600 of the state machine 108 of FIG. 2. As noted above, a proper command sequence includes two register unlock commands, each having a value of 55H or 22H. Both of these commands, in binary, comprise alternating series of 0 and 1 bits. The zero or one logic circuit 600 detects the presence of either of these data patterns and thus helps to verify the correct command sequence. The zero or one logic circuit 600 receives the input data IN(n), n=7.0 and complements thereof. The circuit 600 also receives as an input signals labeled PZ2 and PZ2B which have states related to operation of the memory 100 in byte mode or word mode. If the memory 100 operates in byte mode, the signal PZ2 is high. If the memory operates in word mode, the signal PZ2 is low. The zero or one logic circuit 600 produces outputs ZOODL and ZOO.

The zero or one logic circuit 600 includes input NAND gates 602, 604, 606, 608 and associated inverters 610, 612, 614, 616. The NAND gate 602 receives input signals IN(6), IN(2) and IN(0). The output of the NAND gate 602 is inverted in the inverter 610. The NAND gate 604 receives input signals PZ2, IN3B and IN1B. The output of the NAND gate 604 is inverted in the inverter 612. The NAND gate 606 receives input signals IN6B, IN2B and IN0B. The output of the NAND gate 606 is inverted in the inverter 614. The NAND gate 608 receives input signals PZ2B, IN(3) and IN(1). The output of the NAND gate 608 is inverted in the inverter 616. The outputs of the NAND gates 610, 612 are combined in AND gate 618. Similarly, the output of the NAND gates 614, 616 are combined in AND gate 620. The outputs of the AND gates are combined in a NOR gate 622. The output of the NOR gate 622 is inverted in inverter 624 to produce signal ZOODL at an output 626.

The zero or one logic circuit 600 further includes NAND gates 630 and 632. The NAND gate 630 receives as inputs signals IN7B, IN(6), IN5B, IN(4) and PZ2. The NAND gate 632 receives as inputs signals IN(7), IN6B, IN(5), IN4B and PZ2B. The outputs of the NAND gate 630 and the NAND gate 632 are combined in NAND gate 634. The output of the NAND gate 634 is combined with the signal ZOODL in NAND gate 636. The output of the NAND gate 636 is combined with prelude signal PRELB in NAND gate 638 to form signal zood. This signal is combined with signal ZOOA in NAND gate 640. The output of NAND gate 640 is inverted in inverter 642 to form the signal ZOO at output 644.

The zero or one signal is asserted when the correct address/data pattern sequence is written. The signal ZOOA detects the address pattern provided to another circuit, not shown. ZOOA is active high when the input address is 555H or when the input address is 222H with PZ2 high. Suitable logic circuitry to provide this functionality may be readily rendered by the person ordinarily skilled in the art of logic design. When ZOO is asserted, it sets the ZOO1 and PREL registers (FIG. 7) after the first register unlock command or pattern is written and after the second register unlock command is written, respectively. After the signal PREL (FIG. 7) is high, the data portion of the pattern ZOOD is ignored by ZOO.

FIG. 8 is a schematic diagram of a portion of the control logic of the state machine 108 of FIG. 2. The control logic 700 includes a NAND gate 702, register 704, NAND gate 706 and register 708. The NAND gate 702 receives the signals ZOO from the inverter 642 (FIG. 6) and the signal PRELB from the register 708. The output of the NAND gate is provided to the data input of the register 704, which also receives clocking signals CLK1 and CLK2 and reset signals RESET and RESETB. The output of the register 704 is a signal labeled ZOO1, which is provided as an input to the NAND gate 706. Other inputs to the NAND gate 706 are the signals ZOO and PRELB. The output of the NAND gate 706 is supplied to the data input of the register 708, which also receives clocking signals CLK1 and CLK2 and reset signals RESET and RESETB. The outputs of the register 708 are the true and complement values PREL at output 710 and PRELB at output 712. The prelude registers 704, 708 recognize the register unlocking sequence before the actual command is given and detect the difference between three cycle commands and six cycle commands such as sector erase. If the user inputs two register unlock commands as part of the command sequence, the signal PREL will go active high.

The control logic 700 further includes circuitry to generate the signals PZ2 and PZ2B. The NAND gate 714 receives input signals ZOO1 and PRELB. The output of the NAND gate 714 provides the signal PZ2B at an output 720. This signal is inverted in the inverter 716 to form the signal PZ2 at output 718.

FIG. 8 is a schematic diagram illustrating inhibit circuitry 800 of the state machine 108 for generating the inhibit signal INHB. The inhibit circuitry 800 includes a NOR gate 802, an inverter 804, a NAND gate 806, IH1 block 810, a NOR gate 812, an inverter 814, AND gate 816, 818, NOR gate 820, NAND gate 822, AND gate 824, and NOR gate 826. The inhibit circuit 800 prevents illegal commands from being loaded into the command registers 510, 512, 514, 516 (FIG. 5).

Figure 10:
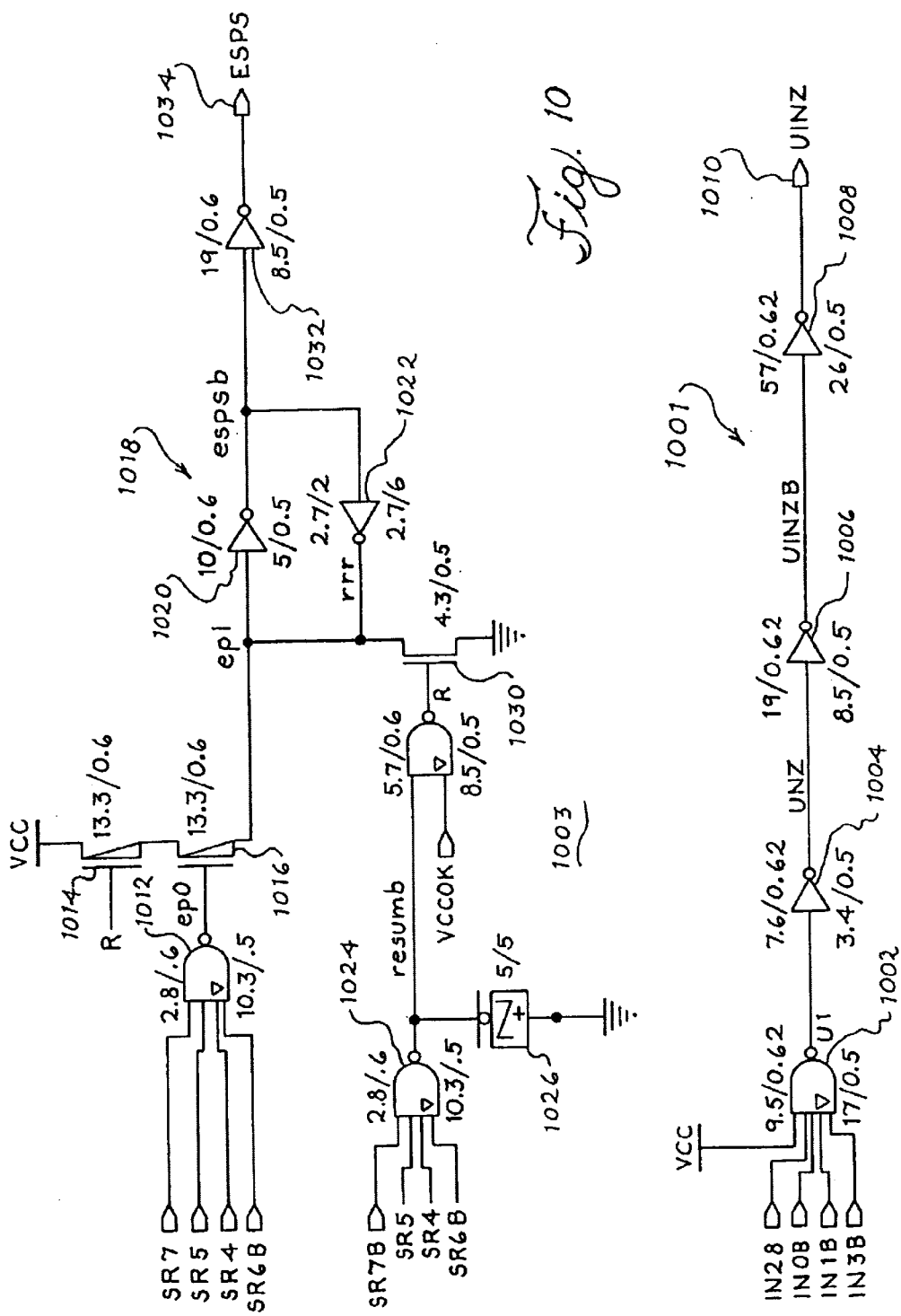
FIG. 10 is a schematic diagram of an erase suspend command decoder circuit and an unused inputs zero detector of the state machine of FIG. 2.
Figure 11:
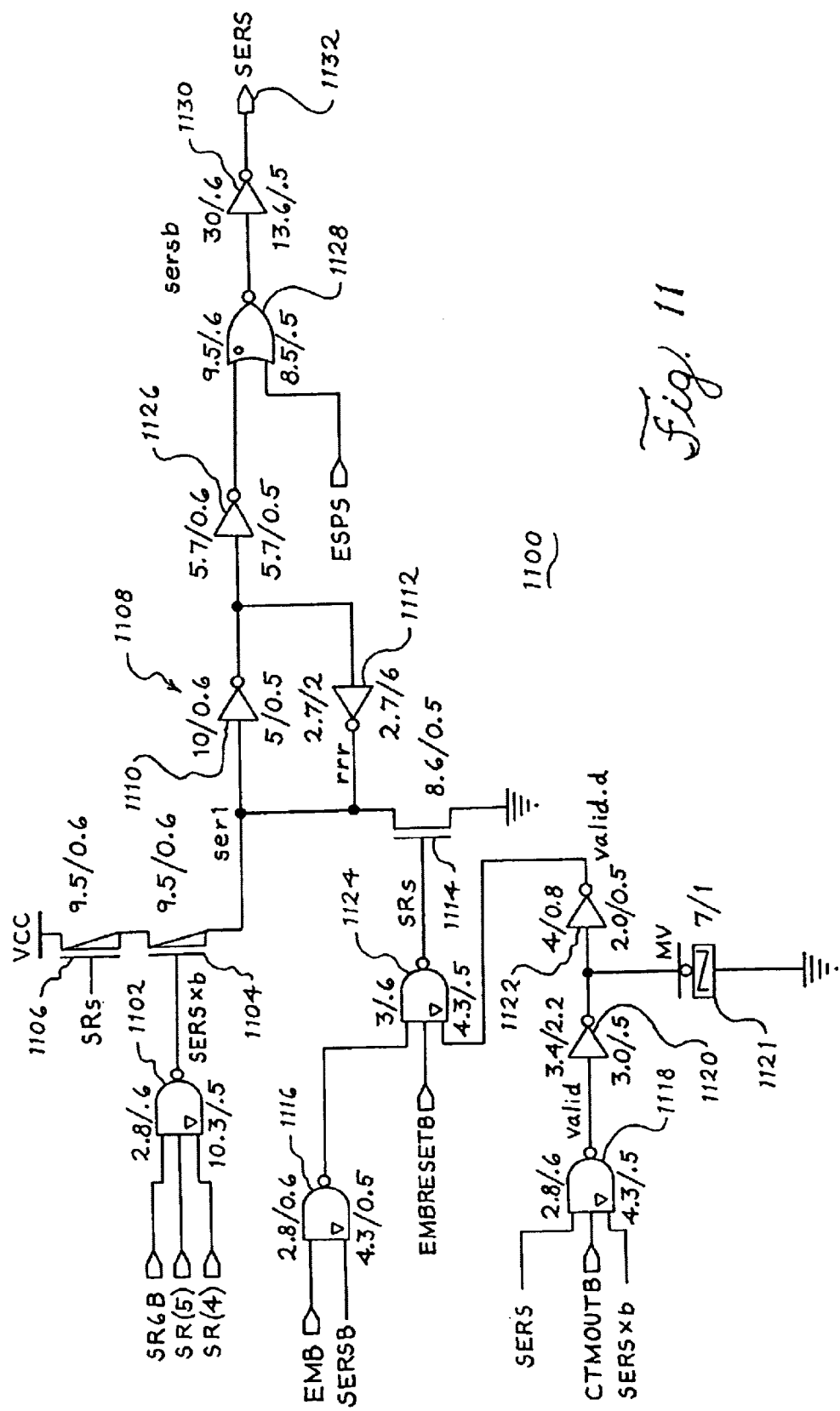
FIG. 11 is a schematic diagram of a sector erase command decoder circuit of the state machine of FIG. 2.

In FIG. 8, the NOR gate 802 receives the signal PREL from the prelude register 708 (FIG. 7) and combines it with the sector erase command signal SERS, which is active high when the sector erase command has been decoded (FIG. 11). The output of the NAND gate 802 is inverted in the inverter 804 and provided to the NAND gate 806. The NAND gate 806 combines this signal with the unused inputs signal UINZ (FIG. 10). The IH1 block 810 combines signals C8, IN(4), IN(5), IN7B, SERS and ZOO to produce an output labeled ih1 in FIG. 8. The IH1 block 810 is described in greater detail in conjunction with FIG. 13. The signal ih1 is combined with the input signal IN(6) in the NOR gate 812. The output of the NOR gate 812 is inverted in the inverter 814.

The AND gate 816 combines the signals IN5B and IN7B. Similarly, the AND gate 816 combines the input signals IN(4) and IN(5). The outputs of these AND gates 816, 818 are combined in the NOR gate 820. The output of the NOR gate 820 is combined in the NAND gate 822 with the signals ZOO and C8B.

The AND gate 824 combines the output of the inverter 814 and the output of the NAND gate 822. The output of the AND gate 824 is combined with the output of the NAND gate 806 in the NOR gate 826 to produce the inhibit signal INHB at the output 828.

Figure 9:
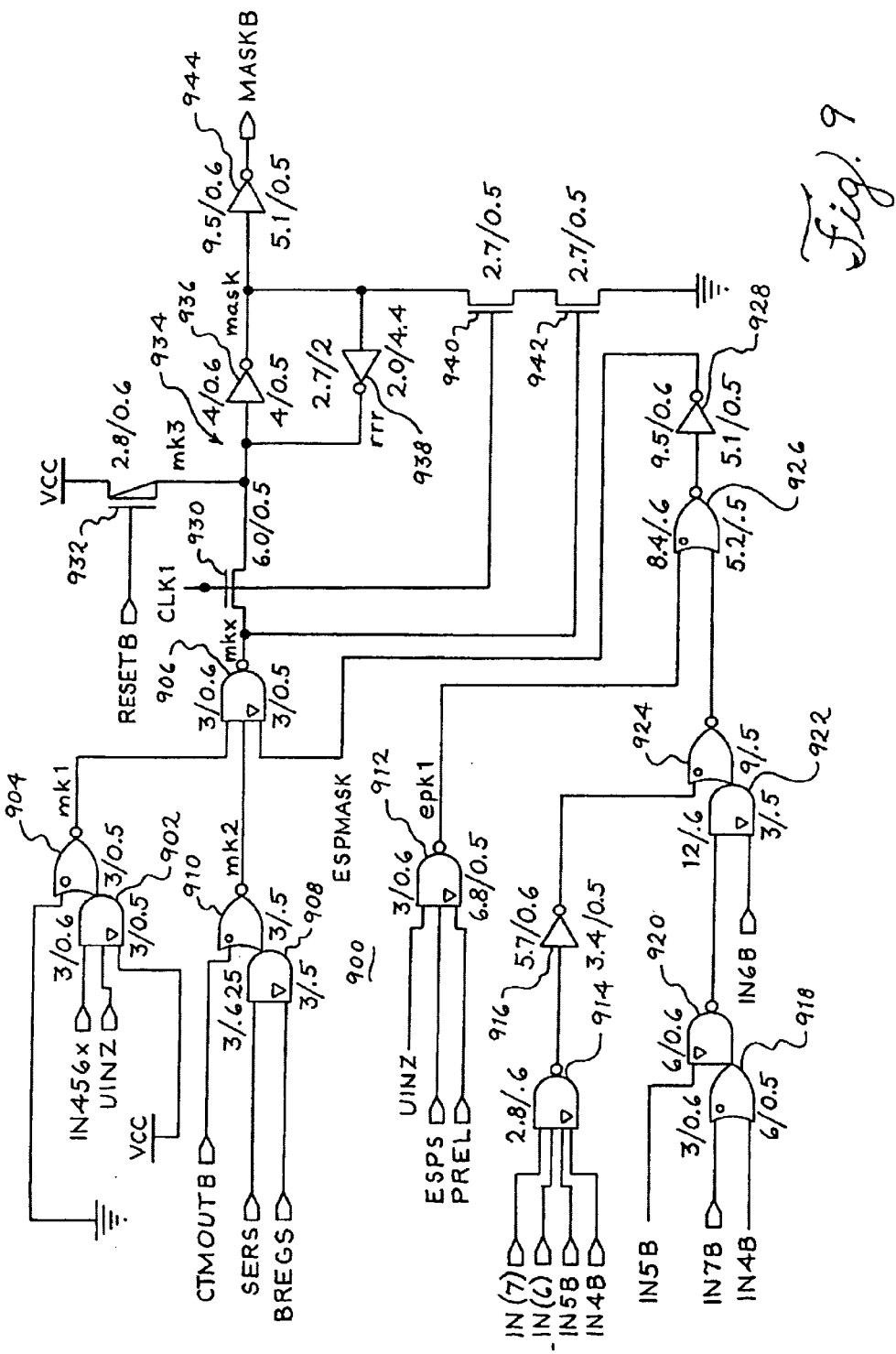
FIG. 9 is a schematic diagram of a masking circuit used to mask out illegal commands during performance of the embedded algorithm by the state machine of FIG. 2.

FIG. 9 is a schematic diagram of mask circuitry 900 used to mask out illegal commands during performance of the embedded algorithm by the state machine 108 of FIG. 2. The mask circuitry 900 includes AND gate 902, NOR gate 904, NAND gate 906, AND gate 908 and NOR gate 910. The mask circuitry 900 further includes NAND gate 912, NAND gate 914, inverter 916, OR gate 918 and NAND gate 920, AND gate 922, NOR gate 924, NOR gate 926 and inverter 928. The mask circuitry 900 asserts the signal MASKB during execution of an embedded operation, except when one of an excepted subset of commands such as burst read is described.

Figure 12:
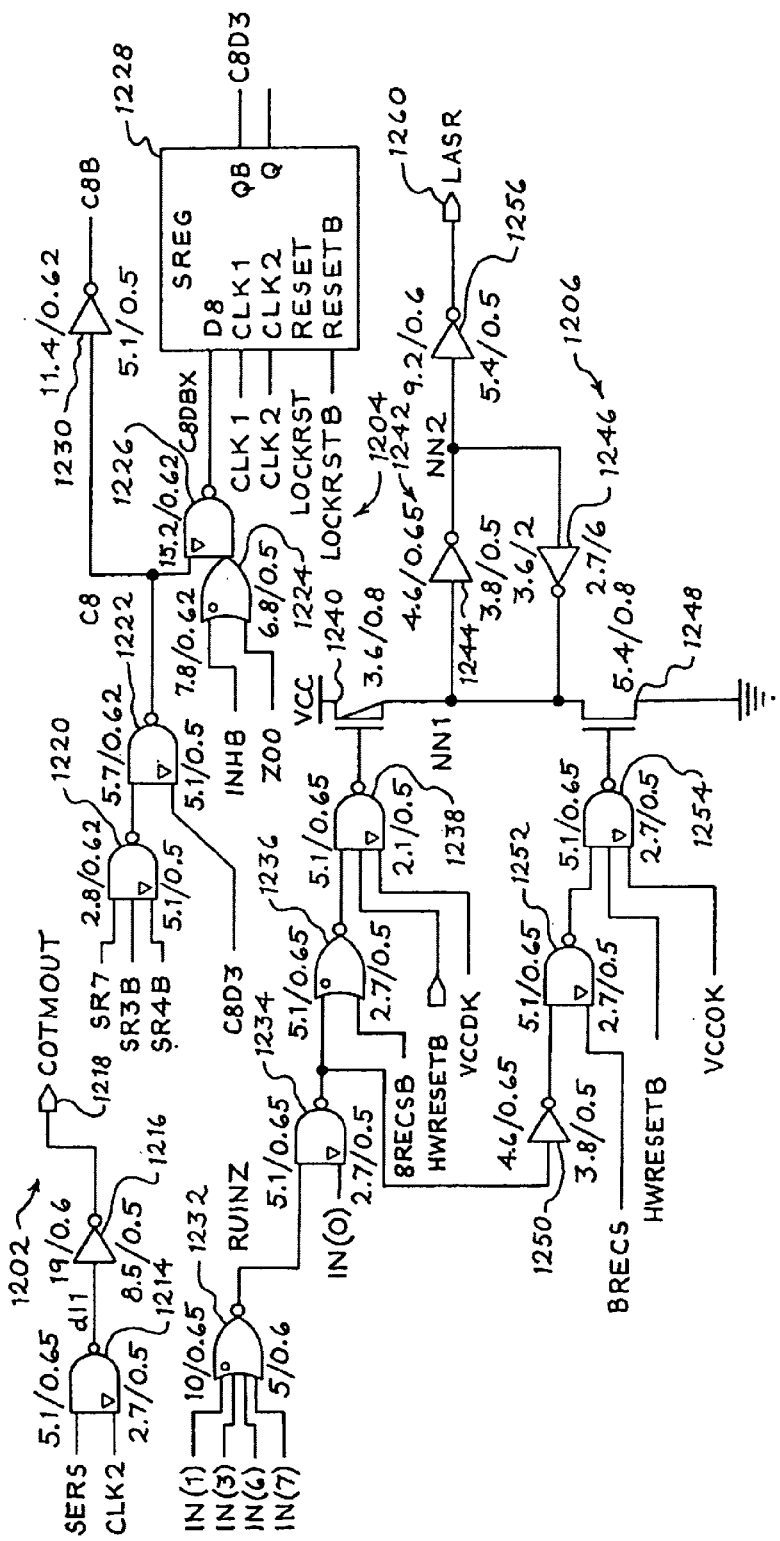
FIG. 12 is a schematic diagram illustrating additional circuits of the command and decode logic of FIG. 2.

The NAND gate 902 combines input signal IN456x and the unused input signal UINZ (FIG. 12). The output of the NAND gate 902 is inverted in the NOR gate 904 and provided to the NAND gate 906. The AND gate 908 receives the sector erase signal (SERS) and the BREGS signal, which indicates that a burst read command has been decoded. The output of this gate 908 is combined in the NOR gate 910 with the time out signal CTMOUTB. The output of the NOR gate 910 is provided to the NAND gate 906.

The NAND gate 912 receives as inputs the unused inputs signal UINZ, the erase suspend signal ESPS, which is active if the memory 100 is in erase suspend mode, e.g., an erase operation was initiated followed by an erase suspend command to temporarily stop the erase operation during performance of another operation, and the prelude signal PREL. The NAND gate 914 receives as inputs data signals IN(7), IN(6), IN5B and IN4B. The output from this gate is inverted in the inverter 916. The NOR gate 918 receives inputs IN7B and IN4B. The output of this gate 918 is combined in the NAND gate 920 with input signal IN5B. The output of this gate 920 is combined in the AND gate 922 with input signal IN6B. The output of AND gate 922 is combined with the output of the NAND gate 912 in the NOR gate 926, whose output is inverted in inverter 928. The outputs of the NOR gate 904, NOR gate 910 and inverter 928 are combined in the NAND gate 906 to produce a signal labeled mkx.

The signal mkx is passed through pass transistor 930 when clocking signal CLK1 is high. This data is latched in the latch 934 which includes inverter 936 and inverter 938.

The latch may be reset by asserting the reset signal RESETB at the gate of p-channel transistor 932. The output of the latch 934 is a signal labeled mask in FIG. 9. Transistors 940 and 942 operate in response to CLK1 and mkx, respectively, to pull the signal mask low at the output of the latch 934. The signal mask is inverted in the inverter 944 to produce the signal MASKB.

FIG. 10 is a schematic diagram of an erase suspend command decoder circuit 1003 and an unused inputs detector 1001. As mentioned above, the erase suspend command interrupts an erase operation in progress to permit performance of another embedded operation. The decoder circuit 1003 includes a NAND gate 1012, p-channel transistors 1014, 1016, NAND gate 1024, capacitor 1026, NAND gate 1028, n-channel transistor 1030, latch 1018 and inverter 1032.

The NAND gate 1012 receives as inputs the signals SR7, SR5, SR4 and SR6B. These are the contained in the command register 206 of the state machine 108. The output of the NAND gate 1012 drives the gate of the p-channel transistor 1016, which is in series with p-channel transistor 1014 between the positive supply voltage Vcc and the input to the latch 1018. The latch 1018 includes a first inverter 1020 and a second inverter 1022. The input to the latch is also driven by the n-channel transistor 1030. The output of the NAND gate 1028 drives the gate of the n-channel transistor 1030. The output of the latch is coupled to an inverter 1032 which provides the erase suspend signal ESPS at output 1034.

FIG. 10 also a schematic diagram of an unused inputs zero detector 1001 of the state machine 108 of FIG. 2. The detector 1001 includes a NAND gate 1002 and inverters 1004, 1006, 1008. The NAND gate 1002 receives input data signals IN2B, IN0B, IN1B and IN3B. The inverters 1004, 1006, 1008 are coupled in series with the output of the NAND gate 1002 to produce the signal UINZ at an output 1010. In the illustrated embodiment, input commands of interest have the binary form of all zeroes in the three lesser significant bit positions. The zero or one circuit 1001 detects this pattern.

FIG. 11 is a schematic diagram of a sector erase command decoder circuit 1100 of the state machine 108 of FIG. 2. The sector erase command decoder circuit 1100 detects the presence of a sector erase command (80H) and, if present, asserts the signal SERS at the output 1132. The circuit 1100 includes a NAND gate 1102, p-channel transistors 1104, 1106 and a latch 1108 including inverters 1110, 1112. The circuit 1100 further includes n-channel transistor 1114, NAND gate 1116, NAND gate 1118, inverters 1120, 1122, capacitor 1121, and NAND gate 1124. The circuit 1100 further includes inverter 1126, NOR gate 1128 and inverter 1130.

The NAND gate 1102 receives as inputs SR6B, SR(5) and SR4. The output of the NAND gate 1102 drives the gate of the p-channel transistor which is coupled in series with the p-channel transistor 1106 between Vcc and the input of the latch 1108. The input of the latch 1108 is also coupled to the drain of the n-channel transistor 1114. The NAND gate 1116 receives as inputs the signals EMB and SERSB. The NAND gate 1118 receives as inputs the signals SERS, CTMOUTB and SERSxb. The output of the NAND gate 1118 is coupled to the inverter 1120. The output of the inverter 1120 is coupled to the capacitor 1112 and the input of the inverter 1122. The NAND gate 1124 receives as input signals the output of the NAND gate 1116, the signal EMBRESETB and the signal LASR from the output of the inverter 1122.

The output of the latch 1108 is coupled to the inverter 1126. The NOR gate 1128 is driven by the output of the inverter 1126 and the erase suspend signal ESPS. The output signal from the NOR gate 1128 is inverted in the inverter 1130 to produce the sector erase signal at the output 1132.

FIG. 12 is a schematic diagram illustrating additional circuits of the command and decode logic 208 of FIG. 2. FIG. 12 illustrates a timeout circuit 1202, an unlock circuit 1204, an asynchronous read unlatch circuit 1206, a reset circuit 1208, an EMB circuit 1210 and a burst read enable circuit 1212.

The timeout circuit 1202 includes a NAND gate 1214 and an inverter 1216. The NAND gate 1214 receives two inputs, the sector erase signal SERS and the clocking signal CLK2. The output signal from the NAND gate 1214 is inverted in the inverter 1216. The output signal from the inverter is provided to the output 1218 as the timeout signal COTMOUT.

The unlock circuit 1204 includes a NAND gate 1220, a NAND gate 1222, an OR gate 1224, a NAND gate 1226, a register 1228 and an inverter 1230. The NAND gate 1220 receives three data bits from the registers 510, 512, 414, 516, SR7, SR5B and SR4B. The NAND gate 1222 receives the output of the NAND gate 1220 and the signal CBD3 from the register 1228 and provides the signal C8 at its output. The OR gate 1224 receives the inhibit signal INHB and the zero or one signal ZOO as inputs and provides its output to the NAND gate 1226. The NAND gate 1226 also receives the C8 signal output of the NAND gate 1222 as an input. The output of the NAND gate 1226 is provided to the data input of the register 1228. The register 1228 also receives the clocking signals CLK1 and CLK2. The register 1228 further receives as reset signals LOCKRST and LOCKRSTB. The inverter 1230 inverts the output signal C8 from the NAND gate 1222 to produce C8B.

The asynchronous read unlatch circuit 1206 includes a NOR gate 1232, a NAND gate 1234, a NOR gate 1236, a NAND gate 1238, a p-channel transistor 1240, a latch 1242 including an inverter 1244 and an inverter 1246, a n-channel transistor 1248, an inverter 1250, a NAND gate 1252, a NAND gate 1254 and an inverter 1256.

The NOR gate 1232 receives the input data bits IN(1), IN(3), IN(6) and IN(7). The output of the NOR gate 1232 is provided to an input of the NAND gate 1234 which also receives as an input the signal IN(0). The output of the NAND gate 1234 is provided to the NOR gate 1236 as an input and to the inverter 1250. The NOR gate 1236 receives as a second input the signal BREGSB from the burst read enable circuit 1212. The NAND gate 1238 receives inputs from the output of the NOR gate 1236, the reset signal HWRESETB and the power signal VCCOK. Signal VCCOK is active high when the voltage Vcc which powers the memory 100 is above a predetermined threshold. In the present embodiment, Vcc has a nominal value of 1.8 volts. VCCOK is high as long as Vcc exceeds 1.2 volts.

The output of the NAND gate 1238 drives the gate of the p-channel transistor 1240 which is coupled between Vcc and the input of the latch 1242. The latch 1242 is also driven by the n-channel transistor 1248. The output of the latch LASR is inverted in the inverter 1256 to produce the asynchronous read latch signal at the output 1260. This signal is active high when the memory 100 is in asynchronous mode and low when the memory 100 is in burst read mode.

The output of the inverter 1250 is provided to an input of the NAND gate 1252 which also receives the input signal BREGS. The output signal from the NAND gate 1252 is provided to an input of the NAND gate 1254, which also receives as inputs the reset signal HWRESETB and VCCOK. The output of the NAND gate 1254 drives the gate of the n-channel transistor 1248.

The reset circuit 1208 includes a NAND gate 1262, a NAND gate 1264, an OR gate 1266 and a NAND gate 1268. The reset circuit 1208 further includes a NAND gate 1270 and inverter 1272. The reset circuit 1208 still further includes a NAND gate 1274, an inverter 1276, a NOR gate 1278 and an inverter 1280.

The inverter 1262 receives as input signals the data bits IN(7), IN(6), IN5B and IN4B. The NAND gate 1264 receives as inputs the data bits IN(4) and IN(5). The output of the NAND gate 1264 is provided to an input of the OR gate 1266 which receives the data bit IN(6) at its other input. The NAND gate 1268 receives as inputs the output of the NAND gate 1262 and the output of the OR gate 1266. The output signal from the NAND gate 1268 is the signal IN456x. The signal IN456x remains high for a burst read command as well as for the sector erase command SERS and the erase suspend command ESPS.

The NAND gate 1270 receives as an input VCCOK and inverts this signal to produce the reset signal RESET. This signal is inverted in the inverter 1272 to produce the reset signal RESETB.

The NAND gate 1274 receives as inputs the signal DONEB and the signal RESETB. The output of the NAND gate 1274 is the reset signal EMBRESET. This signal is inverted in the inverter 1276 to produce the reset signal EMBRESETB. The signal EMBRESET is also provided to the NOR gate 1278 which combines EMBRESET with the sector reset signal SERS. The output of the NOR gate 1278 is the signal LOCKRSTB. This signal is inverted in the inverter 1280 to produce the signal LOCKRST.

The EMB circuit 1210 includes an OR gate 1282, a NAND gate 1284, and inverters 1286, 1288. The OR gate 1282 receives as inputs the timeout signal CTMOUTB and the erase suspend signals ESPS. The output of the OR gate 1282 is inverted in the NAND gate 1284. The output of the NAND gate 1284 is inverted in the inverter 1286 to produce the signal EMBB. This signal is inverted in the inverter 1288 to produce the signal EMB. The signal EMB is active high to indicate the execution of an embedded operation by the back end 204 of the state machine 108. This signal prevents the state machine from issuing another program, erase or other embedded command until the current embedded operation completes execution.

The burst read enable circuit 1212 receives the bits SR4B, SR5B, SR6 and SR7 at the NAND gate 1290 from the registers 510, 512, 514, 516. The output signal from the NAND gate 1290 is the signal BREGSB and is provided at the output 1296. This signal is inverted in the inverter 1294 to produce the signal BREGS, which is provide at the output 1298. When the signal BREGS is active high, it indicates a burst and command has been decoded.

Figure 13:
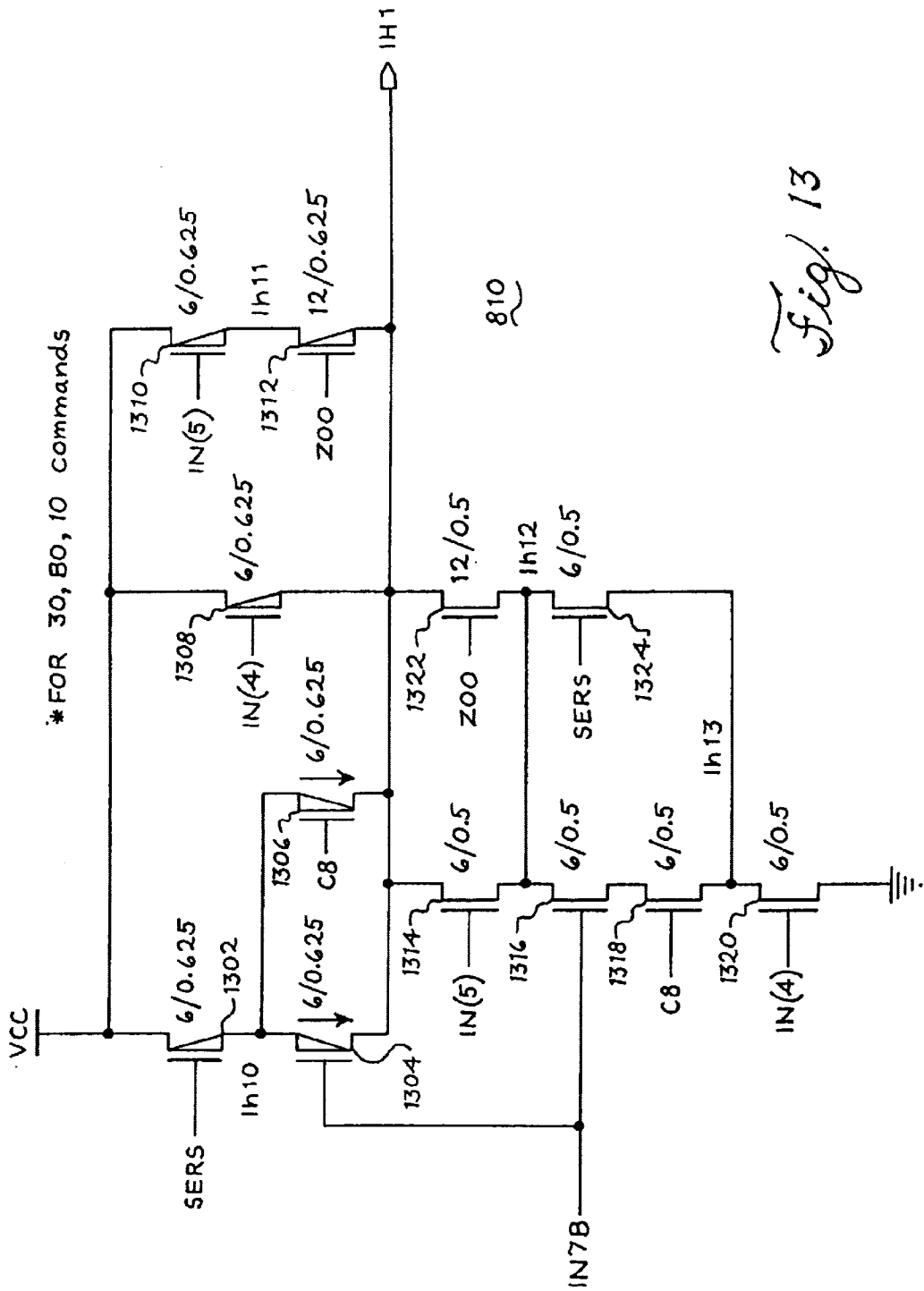
FIG. 13 is a schematic diagram of the inhibit block of FIG. 8.

FIG. 13 is a schematic diagram of the inhibit block 810 of FIG. 8. The inhibit block 810 generates the signal IH1 in response to the sector erase signal, the signal C8, the zero or one signal ZOO and input data bits IN(4), IN(5) and IN7B. In the inhibit block 810, the sector erase signal SERS is applied to a p-channel transistor 1302 and an n-channel transistor 1324. The signal C8 is applied to a p-channel transistor 1306 and an n-channel transistor 1318. The zero or one signal ZOO is applied to a p-channel transistor 1312 and an n-channel transistor 1322. Input data bit IN(4) is applied to p-channel transistor 1304 and n-channel transistor 1320.

Input data bit IN(5) is applied to p-channel transistor 1310 and n-channel transistor 1314. Input data bit IN7B is provided to p-channel transistor 1304 and n-channel transistor 1316.

The p-channel transistor 1302 has a source coupled to the positive voltage supply for the memory 100, Vcc. Transistor 1302 is connected in series with parallel transistors 1304, 1306 between Vcc and the output IH1. P-channel transistor is connected between Vcc and IH1 and transistors 1310 and 1312 are coupled in series between Vcc and IH1. N-channel transistors 1314, 1316, 1318 and 1320 are all coupled in series between IH1 and ground. N-channel transistor 1322 is coupled between IH1 and the common connection between the source of transistor 1413 and drain of transistor 1316. Transistor 1324 is coupled between this same node and ground.

Referring again to FIG. 5, the clocking signal CMDCLK2 opens the registers 510, 512, 514, 516 to latch incoming commands. From FIG. 4, CMDCLK2 at the output 408 follows CLK2 at the output 406 if the masking signal MASKB is high (logic 1), enabling the NAND gate 426. If MASKB is low the NAND gate 426 is disabled and CMDCLK2 does not switch. MASKB is low to mask or inhibit the command from being latched in the registers 510, 512, 514, 516 if the input data is not a valid command. This masking (MASKB low) occurs during several conditions, including during execution of the sector erase command SERS, after a 100 $\mu$sec timeout if the input data is not a burst read command (C0H), or when the burst registers are enabled, when BREGS is high (FIG. 12). MASKB is high during write commands and during the sector erase 100 $\mu$sec timeout. When MASKB is high, the clocking signal CMDCLK2 is enabled to latch in a new command at the outputs of the NAND gates 520, 522, 524, 526. From FIG. 8, if an invalid command is entered (anything but sector erase or C0H), the inhibit signal INHB will go low and the output of the NAND gates 520, 522, 524, 526 will all be high. This condition, with the registers 510, 512, 514, 516 all storing logic 0 values, resets the memory 100 back to asynchronous read mode. This is to ensure that destructive commands such as sector erase are executed only intentionally by the user, not accidentally.

After the sector erase timeout, once execution of the sector erase command begins by the back end 204 of the state machine 108 (FIG. 2), only a limited number of commands will be accepted by the state machine 108. In the illustrated embodiment, these include sector erase (C0H), erase suspend (B0H) or burst read (C0H). These commands form an excepted predetermined subset of commands. These commands are decoded or detected by the MASKB circuit 900 (FIG. 9). These commands drive MASKB high so that it does not disable the command clock CMDCLK2. All other commands make MASKB go low, disabling the command clock CMDCLK2 and preventing the presented command from being latched into the registers 510, 512, 514, 516.

In the sector erase circuit 1100, the signal C8 is active only after the set up command (80H) is detected on the third cycle (FIG. 3). This is an intermediate command that opens the C8 register 1228 (FIG. 12). This is required to enter erase mode of the memory 100 and is added as a precaution against execution of inadvertent erase commands. When the appropriate command sequence for the sector erase SERS command is entered (FIG.3), the registers 510, 512, 514, 516 are set to the values (0011). The signal SERSxb goes low at the output of NAND gate 1102, FIG. 11, setting the latch 1108 and causing the sector erase signal SERS to go high at the output 1132. At the rising edge of the sector erase signal SERS, an internal timer (not shown) is started to time the 100 μsec timeout period after the last write.

During this timeout period, the timeout signal CTMOUTB is high at the output 1218 of the timeout circuit 1202 (FIG. 12). This forces the masking signal MASKB high by operation of the NOR gate 910 (FIG. 9). With the masking signal MASKB high, the command clock CMDCLK2 is enabled and follows CLK2. On the other hand, if an inappropriate data sequence is entered, i.e., the user entered data is not 30H or B0H, the contents of the registers 510, 512, 514, 516 change as the command clock signal CMDCLK2 latches in the new data. In response, the NAND gate 1102 decodes the inappropriate data and the signal labeled SERSxb at the output of the NAND gate 1102 goes high (FIG. 11). The signal SERSxb is provided to the NAND gate 1118 (FIG. 11) and causes the signal labeled Valid to go low. This resets the latch 1108 by turning on the gate of the n-channel transistor 1114 through the NAND gate 1124. With the latch 1108 reset, the sector erase signal SERS is driven low and the sector erase operation is terminated. Accordingly, to execute a burst read command during the sector erase timeout, the memory 100 must first enter erase suspend mode by execution of the erase suspend command ESPS.

Once the sector erase timeout has expired, the timeout signal CTMOUTB goes low and keeps the latch 1108 from being reset so that during execution of the sector erase command the sector erase remains undisturbed. With CTMOUTB low, the sector erase signal SERS cannot be reset to its inactive low state.

In the masking circuit 900 (FIG. 9), if no burst read command has been received, after the timeout signal CTMOUTB goes low the output of the NOR gate 910 stays high. If the input data does not correspond to a sector erase command (C0H), the setup command (B0H) or a burst read command (30H), the signal IN456x from the reset circuit 1208 which decodes the input command (FIG. 12) will go low. This forces the output of the NOR gate 905 high. As a result, the output of the NAND gate 906 goes low, setting the masking signal MASKB low when CLK1 goes high. With MASKB low, the command clock CMDCLK2 is disabled, preventing the registers 510, 512, 514, 516 from changing states. In this manner, invalid commands are ignored by the state machine 108.

If the input data has a value (1100) indicating a burst read command, the burst read signal BREGS will be set in the burst read circuit 1212 (FIG. 12). The input data written on the following cycle will determine if the asynchronous read latch 1242 will be set or reset, enabling or disabling the asynchronous read signal LASR at the output 1260. At the next rising edge of the next following cycle, at time T, the signal BREGS needs to be disabled to keep the asynchronous read latch 1242 from being disturbed in the circuit 1206. In the masking circuit 900 (FIG. 9), when the BREGS signal is high, the output of the NOR gate 910 will go low so that the command clock signal CMDCLK2 will pulse high at time T to reset the registers 510, 512, 514, 516 and reset the signal BREGS, which is determined in the circuit 1212 (FIG. 12) by decoding the contents of the registers 510, 512, 514, 516.

On the other hand, if the input data is (1011), corresponding to the erase suspend command, the erase suspend latch 1018 of FIG. 10 will get set by action of the erase suspend circuit 1003. The erase suspend latch can only be reset by entering the resume command (30H). During erase suspend, the erase suspend mask logic of the masking circuit 900 at the lower left of FIG. 9 will force the masking signal MASKB to be low. This masks out invalid commands by disabling the command clock CMDCLK2 to keep the registers 510, 512, 514, 516 from changing state.

When the embedded erase operation is finished, the signal DONEB will go low in the reset circuit 1208 (FIG. 12). The causes the reset signal EMBRESET to go high, resetting the sector erase latch 1108 by means of the NAND gate 1124 (FIG. 11). The NAND gate 1124 turns on the n-channel transistor 1114, resetting the latch 1108. Similarly, the lock reset signal LOCKRST will pulse high in the reset circuit 1208 (FIG. 12) to reset the C8 register 1228 in the circuit 1204. This prevents the sector erase signal SERS from getting set without the appropriate data sequence. Once the sector erase signal SERS signal is reset, the timeout signal CTMOUTB will go high (logic 1). Again, the inhibit signal INHB and the command clock signal CMDCLK2 will prevent the registers 510, 512, 514, 516 from being set with an unintended data input sequence.

In a previous memory design which did not permit burst reading simultaneously with an embedded write or erase operation, the reset operation reset all registers and latches in the state machine 108. The reset signal was active when the memory was powered down and when an embedded operation finished. The present embodiment provides for multiple reset signals. The signal EMBRESET from the reset circuit 1208 resets the sector erase latch 1108 when the DONEB signal is asserted to indicated that the embedded operation is complete. The RESET signal from the NAND gate 1270 in the reset circuit 1208 does not depend on DONEB at all. It is used to reset the zero or one register 704 and the prelude register 712 (FIG. 7). Use of the RESET signal for resetting the registers 704, 712 prevents those registers 704, 712 from being reset when an embedded operation ends, preserving a burst read operation which has been initiated by the user.

From the foregoing, it can be seen that the present embodiments provide improved method and apparatus for performing simultaneous operations in a memory device such as a flash memory. Upon receipt of the correct command sequence, an embedded operation is initiated by a state machine of the memory. During execution of the embedded operation, other commands are ignored or locked out, with some exceptions. If one of the excepted commands, such as a burst read, is detected, it is processed and execution begins simultaneously with the embedded operation.

It is to be noted that suitable transistor sizes specifying channel width to length ratios (measured in micrometers or microns) for the transistors which make up the depicted circuits are included in the drawing figures. These device sizes are intended to be exemplary only. It will be appreciated that suitable ratios may be chosen depending on the design requirements and the capabilities and limitations of the particular integrated circuit fabrication process used for implementation of the circuit as well as the performance requirements of the specific embodiment.

While a particular embodiment of the present invention has been shown and described, modifications may be made. For example, other operations beside a burst read operation may be initiated during execution of the embedded operation, and other embedded operations beside the sector erase operation may be performed. The operations described herein are exemplary only. Accordingly, it is therefore intended in the appended claims to cover such changes and modifications which follow in the true spirit and scope of the invention.

What is claimed is:

1. A memory device comprising:
   a first bank of data storage cells;
   a second bank of data storage cells; and
   a state machine configured to initiate an embedded burst read operation from the second bank while currently controlling an embedded sector erase operation to the first bank, said state machine comprising internal command and decode logic, wherein said embedded sector erase operation comprises initiating an unlock register command at a first cycle and a second cycle, initiating a sector erase command at a third cycle, initiating said unlock register command at a fourth cycle and a fifth cycle, and initiating a sector address at a sixth cycle, and wherein said embedded burst read operation comprises initiating said unlock register command at said first cycle and said second cycle, initiating a burst read command at said third cycle, and enabling said burst read command at said fourth cycle.

2. The memory device of claim 1 wherein the state machine comprises:
   a front end to decode received user commands; and
   a back end to control embedded operations including the embedded write operation in response to the user commands.

3. The memory device of claim 2 wherein the front end is configured to decode a burst read command while the back end controls the embedded write operation.

4. The memory device of claim 2 wherein the front end is configured to permit execution of only predetermined user commands during the embedded write operation.

5. The memory device of claim 4 wherein the predetermined commands include a burst read command.

6. The memory device of claim 1 further comprising:
   a valid address input to receive an indication of a user specified burst read address; and
   a clock input for receiving a burst read clocking signal.

7. The memory device of claim 1 further comprising:
   decoding circuitry to decode a received read command; and
   one or more registers to store received write command data related to the embedded write operation during execution of the embedded write operation.

8. The memory device of claim 7 further comprising:
   a clocking circuit coupled with the one or more registers to generate a command clock signal for latching command data in the one or more registers; and
   a masking circuit to generate a mask signal to disable the command clock signal when received command does not correspond to a valid command.

9. The memory device of claim 1 wherein the state machine further comprises:
   verification circuitry to identify a correct command sequence before initiating the embedded write operation to the first bank.

10. A method for operating a memory comprising:
    receiving a command defining an embedded sector erase operation;
    in response to the command, initiating embedded sector erase operation comprising:
      at a first cycle, initiating an unlock register command;
      at a second cycle, initiating the unlock register command;
      at a third cycle, initiating a sector erase command;
      at a fourth cycle, initiating the unlock register command;
      at a fifth cycle, initiating the unlock register command;
      at a sixth cycle, initiating a sector address;
    receiving a subsequent command defining a burst read embedded operation;
    if the subsequent command is one of an excepted predetermined subset of commands, initiating execution of the burst read embedded operation during execution of the embedded burst read operation comprising:
      at the first cycle, initiating the unlock register command;
      at the second cycle, initiating the unlock register command;
      at the third cycle, initiating a burst read command;
      at the fourth cycle, enabling the burst read command; and otherwise, ignoring the subsequent command.

11. The method of claim 10 further comprising:
    receiving a command sequence including the command.

12. The method of claim 11 further comprising:
    verifying commands of the command sequence.

13. The method of claim 12 further comprising:
    if commands of the command sequence do not match a predetermined command sequence, terminating the embedded operation.

14. The method of claim 10 further comprising:
    if the subsequent command comprises a burst read command, initiating a burst read while simultaneously executing the embedded operation.

15. The method of claim 14 wherein the embedded operation comprises a sector erase of a sector of the memory.

16. A method for operating a flash memory, the method comprising:
    in response to a received sector erase operation command, initiating an embedded sector erase operation of the flash memory, the embedded sector erase operation comprising:
      at a first cycle, initiating an unlock register command;
      at a second cycle, initiating the unlock register command;
      at a third cycle, initiating a sector erase command;
      at a fourth cycle, initiating the unlock register command;
      at a fifth cycle, initiating the unlock register command;
      at a sixth cycle, initiating a sector address;
    subsequently, during execution of the embedded sector erase operation, in response to a received burst read command, initiating a burst read operation of the flash memory, the burst read operation comprising:
      at the first cycle, initiating the unlock register command;
      at the second cycle, initiating the unlock register command;
      at the third cycle, initiating a burst read command; and
      at the fourth cycle, enabling the burst read command.

17. The method of claim 16 further comprising:
    receiving a sequence of commands including the operation command;
    if the sequence of commands does not match a predetermined sequence, suspending initiation of the embedded operation.

18. The method of claim 16 further comprising:
    during execution of the embedded operation, receiving a command;
    decoding the command;
    if the command corresponds to one of an excepted predetermined subset of commands, initiating the burst read operation; and
    otherwise, ignoring the command.

19. The method of claim 18 further comprising:
    storing data corresponding to the received operation command; and
    after storing, decoding subsequent commands including the command.

* * * * *